United States Patent
Körting et al.

(10) Patent No.: US 7,336,087 B2
(45) Date of Patent: Feb. 26, 2008

(54) CIRCUIT BOARD TEST DEVICE COMPRISING CONTACT NEEDLES WHICH ARE DRIVEN IN DIAGONALLY PROTRUDING MANNER

(75) Inventors: Torsten Körting, Bremen (DE); Clayton Depue, Arlington, VA (US); Thomas Lück, Hamburg (DE)

(73) Assignee: Scorpion Technologies AG, Hamburg (DE)

( * ) Notice: Subject to any disclaimer, the term of this patent is extended or adjusted under 35 U.S.C. 154(b) by 0 days.

(21) Appl. No.: 10/555,514

(22) PCT Filed: May 3, 2004

(86) PCT No.: PCT/EP2004/004671

§ 371 (c)(1),
(2), (4) Date: Dec. 6, 2005

(87) PCT Pub. No.: WO2004/099803

PCT Pub. Date: Nov. 18, 2004

(65) Prior Publication Data

US 2006/0290368 A1 Dec. 28, 2006

(30) Foreign Application Priority Data

May 6, 2003 (DE) ................ 103 20 381

(51) Int. Cl.
*G01R 31/02* (2006.01)
*G01R 31/26* (2006.01)

(52) U.S. Cl. .................. 324/758; 324/754; 324/761
(58) Field of Classification Search ........ 324/754–765, 324/158.1
See application file for complete search history.

(56) References Cited

U.S. PATENT DOCUMENTS 5,394,100 A * 2/1995 Bohler et al. ............... 324/758

(Continued)

FOREIGN PATENT DOCUMENTS

DE 19503329 C2 8/1996

(Continued)

OTHER PUBLICATIONS

WO 03/096037 A1, Device and Method for Testing Printed Circuit Boards, and Testing Probe for Said Device and Method, Publication Date: Nov. 20, 2003.

*Primary Examiner*—Ha Tran Nguyen
*Assistant Examiner*—Emily Y Chan
(74) *Attorney, Agent, or Firm*—Rankin, Hill, Porter & Clark LLP

(57) ABSTRACT

The invention relates to printed circuit board test devices (1) comprising a support (4) receiving a circuit board (5) by said board's edges, said board being designed to be fitted as needed with electrical or electronic components (20), said devices further comprising at least one needle (15) which is connected to an electrical test device (17) and which shall electrically contact contact areas (21) on the board (5), the needle (15) being obliquely displaceable by a needle drive (13) in the needle direction, the needle drive being adjustable—by at least one holding-fixture drive (8)—in a adjustment plane (7) which is parallel to the circuit board (5), the drives (8, 13) being actuated by a needle control (10) to spatially position the needle tip (18) at a predetermined spatial coordinate, said devices (1) being characterized in that it includes a distance measuring device (25, 13') designed to measure the distance between the adjustment plane (7) and the circuit board (5, 5') at least at one site and to transmit the measured values to the drive control (10), this drive control in turn being designed that, prior to the contacting time at the contact areas (21; 21'), appropriate correction based on the measured distance values, of the spatial coordinates of the contact areas (21, 21') shall be carried out.

2 Claims, 1 Drawing Sheet

U.S. PATENT DOCUMENTS

Figure 1:
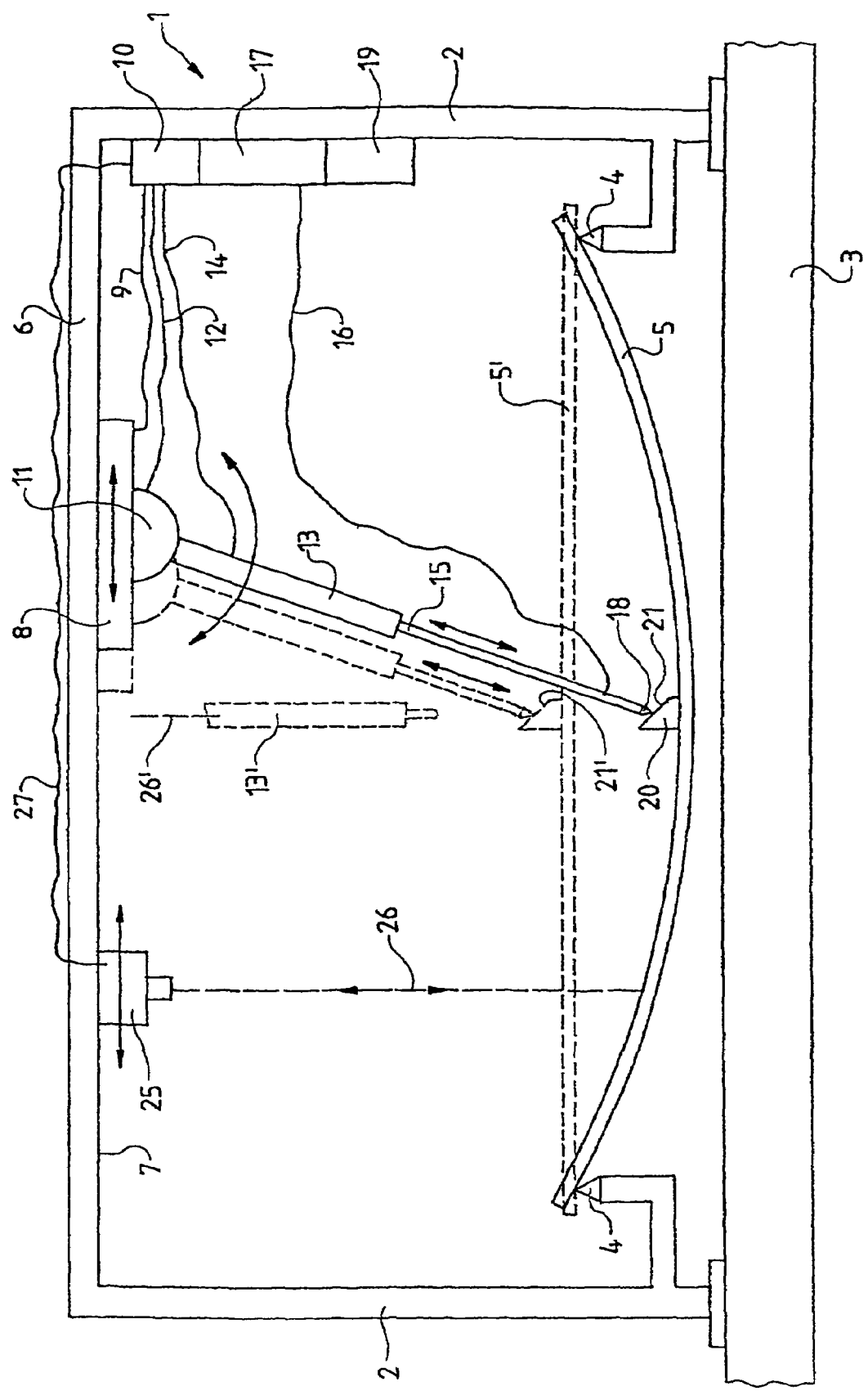

| | | |
|---|---|---|
| 5,850,146 A | 12/1998 | Shim et al. |
| 6,191,597 B1 * | 2/2001 | Driller et al. ............... 324/758 |
| 6,307,389 B1 * | 10/2001 | Buks et al. ................. 324/758 |
| 6,445,193 B1 * | 9/2002 | Trummer et al. ........... 324/644 |
| 7,015,711 B2 * | 3/2006 | Rothaug et al. ............ 324/758 |
| 2001/0028254 A1 | 10/2001 | Buks et al. |
| 2005/0134842 A1 * | 6/2005 | Savareigo et al. ........ 356/237.5 |

FOREIGN PATENT DOCUMENTS

| | | |
|---|---|---|
| JP | 02130477 A * | 5/1990 |
| JP | 02130477 A | 5/2000 |

* cited by examiner

CIRCUIT BOARD TEST DEVICE COMPRISING CONTACT NEEDLES WHICH ARE DRIVEN IN DIAGONALLY PROTRUDING MANNER

Circuit board test devices are used to contact circuit boards whether fitted or not with components by applying needles to contact areas. These needles are connected to electrical test apparatus performing electrical measurements between contacting areas of the circuit board, for instance measurements of resistance, capacitance, inductance and the like. In this manner circuit boards devoid of components may be checked for conductor track continuity and, as regards circuit boards fitted with components, the latter may be checked for proper soldering, satisfactory operation and the like. Circuit board test devices are mandatory in production when monitoring electronic gear.

Said needles may be moved above and parallel to the circuit board in order to reach arbitrary contact areas and to make contact with them. An arbitrary plurality of needles may be used simultaneously. The contact areas may be segments of the conductor tracks or on the components, for instance of the IC terminals.

As regards circuit board test devices of this kind such as are described in the German patent document DE 19503329 C2 or in U.S. Pat. No. 5,850,146, the needles are configured obliquely and offer, thereby, the advantage that they are able to contact the circuit board not only from above, for instance at a conductor track, but also laterally, for instance making contact with an area which is slanted or perpendicular to the circuit board, for instance an area of an IC leg.

In light of the presently ever increasing density of components integrated on circuit boards, the available contact areas become ever smaller. High needle positioning accuracy is required in order to accurately target these minute areas, that are for instance less than 1 $mm^2$.

The contact areas to be contacted are computed from the circuit board layout and are preset in the drive control which, by means of these coordinates, that is by means of x, y coordinates in the circuit board plane, then operate on those areas. If component areas must be checked out, that is, areas situated above the circuit board surface, then the z-coordinate must be added, and therefore the areas then entail 3D spatial coordinates.

If circuit board test devices of a different kind are used, which include needles configured perpendicularly to the horizontal circuit board, a purely x, y control will suffice. The needles always move in the z-direction and may be displaced in the absence of a targeted spatial coordinate until they make contact. As regards the above cited design including oblique needles, the spatial coordinate of the contact area always must be calculated in order that the contact area may be reached while taking into account both the x, y position of the needle drive and the oblique needle advance.

The above procedure, however, entails a problem so far not overcome in the state of the art. The previously described control of the contact areas using spatial coordinates from the circuit board layout is satisfactory only for ideally plane circuit boards. This is not the always the case however. The circuit boards may be bent or wavy. Such deformations may be due to stresses in manufacture or be of thermal origin. The circuit boards may even be unevenly wavy. Because these boards must be gripped at their edges in order to keep the maximum surface accessible for contacting, bends cannot be corrected in the circuit board test device. In particular, circuit board bending takes place when conventionally gripping the opposite edges horizontally. In that case, and depending on material rigidity and loading, the circuit board will sag more or less. Such loading may be quite substantial when the circuit board is fitted with heavy components. Deviations of several mm from the ideal plane shape of the circuit board must always be expected.

As regards known circuit board test devices of the above kind, a mean value Z of warping must be added as compensation. However, for such boards sagging in an arcuate manner, this z-deviation varies across the circuit board's surface. This is especially the case with wavy circuit boards. As a result, high contacting accuracy is precluded.

When, in known circuit board test devices, the needle is moved obliquely to the calculated spatial coordinate of a contact area, if the latter is situated too low, then the needle will miss it. The missed contacting action significantly interferes, sometimes totally, with the overall testing procedure. This effect increases in seriousness, the shallower the angle of incidence of the needle relative to the said area.

The patent document WO 02/08774 A1 discloses a design, not of the species described above, where an oblique probe is moved by an elevation drive to make contact with a contact point on a surface element. The speed of motion is controlled by continuously measuring the gap in height between the tip of the probe and the contact point, namely by using a complex image analyzer analyzing the images of the probe tip or of the contact point or the shadows cast by the probe tip on the area to be contacted. This measurement is relative.

U.S. Pat. No. 5,812,409 discloses a design, not of the species described above, of a retrieval device which removes objects from a tray at a constant stroke excursion. If the tray rests obliquely on its bench, then the obliqueness is measured by light beams and the bench height is adjusted to allow appropriate retrieval.

These known designs are inapplicable to the problem defined above in the said species of the state of the art.

The objective of the present invention is to create printed circuit board test devices of the above species, offering contacting accuracy that is independent of circuit board deformations.

In the present invention the distance between the adjustment plane and the circuit board is measured before contacting takes place. If the circuit board is sagging, this fact is ascertained and the spatial coordinate of the contact area to be serviced is commensurately modified. In this manner even minute contact areas can be accurately serviced. Because the circuit board's sagging depth is being ascertained, the accuracy of servicing is assured regardless of any board deformation.

Arbitrary gap sensing devices may be used, for instance mechanical sensors, optical or acoustic gap determining devices. Illustratively laser triangulation sensors that are conventional in this field may be used. After the needle has been steered into the perpendicular position, the needle drives may be used as the distance sensing device. The circuit board elevation is ascertained knowing the needle path from a known zero position until contact, said path being ascertained by the sensor. Because a special distance sensing device is not needed, the design is accordingly simplified.

A single measurement suffices, preferably at the circuit board center. Thereupon, using the known bending curve, the accurate elevations of all contact areas to be contacted can be determined.

Alternatively, the distance may be measured at several circuit board sites and from these, by interpolation, the circuit board's distance profile for all its sites may be ascertained. In this manner, unevenly deformed (wavy) circuit boards may be accurately mapped.

Measuring the circuit board's deviations must precede contacting because accurate contacting presumes a measured distance value. The distance measurement is made before the electrical measurement takes place and thus the deviation profile will be known and hence the kind of curvature of the circuit board. Once this knowledge has been gathered, all electrical measurements, i.e. all contacts with the contact areas may be carried out properly.

If distance measurements are carried out during the electrical measurements, then the changes in a circuit board's deformation during the very electrical measurement also may be ascertained.

In a single FIG. 1, the drawing illustratively and schematically shows a sideview of a printed circuit board test device of the present invention.

FIG. 1 is a side view of a circuit board test device 1 resting by two vertical rests 2 on a surface, for instance, of the shown bench 3. A printed circuit board 5 rests on two supports 4 of the circuit board test device 1 and may be replaced after completion of the testing pass by the next circuit board to be tested. The circuit board 5 rests by opposite edges on the supports 4 in order that its various surface elements be freely accessible for testing. In the shown embodiment mode, the circuit board is tested only from above. However and in a manner not shown, the circuit board testing device 1 also may be designed to additionally test from underneath.

A adjustment plate 6 is mounted parallel to the circuit board 5, i.e. parallel to the surface subtended between the supports 4 and is held by the rests 2, and it is spaced above said board. A holding-fixture drive 8 is present at the underside of said plate 6, namely at the adjustment plane 7, said drive 8 being displaceable in the direction of the arrow, namely in the direction of the adjustment plane 7 and hence parallel to the circuit board 5 and for that purpose being controlled from a drive control 10 by means of a cable 9. The holding-fixture drive 8, preferably, is displaceable in the x- and y-directions in the adjustment plane 7 in order to make all planar sites accessible.

The holding-fixture drive 8 bears an angle drive 11 itself actuated from the drive control 10 through a conductor 12 to adjust the angle of a needle drive 13 which in turn is controlled from the drive control 10 by means of a conductor 14.

The needle drive 13 is designed to move a needle 15 in the direction of needle advance. The needle 15 is connected by a conductor 16 to a measuring device 17 than can perform electrical measurements at the sites of the circuit board 5 which are contacted by the needle tip 18.

As shown, the drive control 10 and the measurement device 17 may be part of a computer system 19. Illustratively and for graphical simplicity, the circuit board 5 is shown fitted with only one component 20 that comprises an oblique contact area 21. It is desired to contact this area 21 with the needle tip 18 to perform an electrical measurement. For that purpose the circuit board 5 is contacted also at another site, for instance by means of the supports 4, to electrically grounded points on the underside of the circuit board 5. However, in general, the second contacting location is situated just as is the one illustrated in this FIGURE at the top side of the circuit board 5 at an omitted contact area by means of a further needle which, independently of the needle shown in FIG. 1, is displaceable and may be positioned by means of corresponding devices 8, 11, 13.

The accurate position of the contact area 21 is known from the design data, i.e. the circuit board layout, of the circuit board 5. These data are accessible to the drive control 10 in such a way that it can control the holding-fixture drive 8, the angle adjustment element 11 and the needle drive 13 so that the spatial coordinate of the center of the contact area shall be approached as the needle 15 moves in the needle direction. In the shown embodiment including the angle adjustment drive 11, the needle's oblique angle may be adjusted in a manner so that the contact area 21 shall be contacted as orthogonally as possible.

The circuit board 5 shown in solid lines in FIG. 1 sags under its own weight between the supports 4. This condition is shown in a much exaggerated manner for the sake of clarity in FIG. 1. If the circuit board would not sag, for instance being illustratively made of a substantially rigid material or being fitted for instance with lightweight components, then, in the extreme case, it would be fully planar as indicated by the dashed lines of the shown board 5'. When the needle is advanced in the shown position of the needle drive 13, then it will not impact the contact area 21' on the plane surface 5' as made clear by the FIGURE. The spatial coordinates of the contact area 21' are quite different. In such a case the needle drive would have to be moved into the position shown in dashed lines by adjusting the holding-fixture drive 8 into the dashed-line position. The angular adjustment drive 11 also could be modified commensurately.

This discussion makes it clear that for differently bent, i.e. sagging circuit boards 5, 5', different spatial coordinates are in play at the contact areas. The coordinates known from the board layout are those of the ideal circuit board condition shown in FIG. 1 in dashed manner by 5'.

Circuit boards may sag differently. As a result and as shown by the circuit board 5 in FIG. 1, the deviation in elevation is more pronounced at the center than at the edges. Under some circumstances, the said boards also may be wavy.

To compensate for such conditions, the invention provides a distance measuring device 25 which in this illustrative embodiment mode is configured to be displaceable in the adjustment plane 7 and illustratively ascertains by means of an optical or acoustic beam 26 the distance between the circuit board 5 and the adjustment plane 7. The distance measuring device 25 may be moved over the entire surface of the board 5 and measure the distances of many sites. These distance measurements are transmitted by the cable 27 to the drive control 10, said control then being enabled to calculate, by means of measurement value interpolation, the accurate elevations of all the points of the circuit board 5. Accordingly, the accurate elevation sites of contact area 21 respectively 21' can be ascertained, whereby, depending on the sag of such contact area, either the site 21 or 21' may be serviced. This condition applies to all further but omitted contact areas to be approached which are present on the circuit board 5.

Moreover, and in a manner not shown, the sagging of the circuit board 5 may be measured at the board center using a beam 26'. The circuit board's sagging function known from mechanical statics then may be used to determine the deviation in elevation of any site on the board 5.

Another embodiment mode omits the distance measuring device 25 of which the function then is assumed by the needle drive 13. For that purpose said drive 13 is moved by the angular adjustment element 11 into the vertical position 13', namely above a site to be contacted of the circuit board 5, for instance above the contact area 21, 21'. Next, the needle is moved downward from a rest position of known elevation until the measurement device 17 ascertains contact. The excursion so carried out is determined from the needle's speed and its time of travel and accordingly the elevation of the contact area 21 or 21' can be determined as well. Illustratively, using a stepping motor for the needle drive 13, the steps may be counted in simple manner. An arbitrary number of distance measurements may be carried out at different sites of the circuit board 5 by displacing the holding-fixture drive 8 in the adjustment plane 7, and accordingly an accurate elevation profile also may be derived at different sites of the circuit board 5 when it is unevenly deformed.

Preferably, the above described distance measurement of the circuit board 5 determining its accurate elevation is carried out at the beginning of testing once the said board has been put in place. Said elevation profile measurement is carried out in one of the above modes and—from the known sites of the contact areas to be services and resulting from the circuit board layout, and from the measured elevation profile for all contact areas—the drive control 10 can determine the accurate spatial coordinates—the drive control can determine the accurate spatial coordinates in order to accurately move the oblique needle 15 toward said contact areas. Thereupon electrical testing, namely making contact with the contact area to determine proper operation of the circuit board 5, begins.

However, distance measurements may also be carried out while electrically testing the circuit board. If the distance measuring device 25, which operates in a contact-free manner, is used, then it may continuously carry out distance measurements during testing. In this manner, the circuit board elevation may be monitored during servicing in order to allow further adjustment, if needed, of the spatial coordinates. Such a condition may be encountered, for instance, when a large plurality of needles contact the circuit board 5 from above and by their contacting force additionally deform said board downward.

If, as already mentioned above, circuit board contacting from underneath is provided, so that the design shown in FIG. 1 above the circuit board 5 now would be present underneath it, though in a mirrored manner, then the corresponding spatial coordinates may be modified by distance measurement in order to compensate sagging. The same principle applies to circuit board test devices that make contact both from above and below with a circuit board which bears components on both sides.

The invention claimed is:

1. Printed circuit board test device (1) comprising:
a support device (4) receiving a circuit board (5) at latter's edge, said board being designed to receive electrical or electronic components (20) or being fitted with them,
at least one needle (15) which is designed to make electrical contact with contact areas (21) on the circuit board (5) and which is connected to an electrical testing device (17),
said needle (15) being obliquely arranged and adjustable in the direction of the needle by a needle drive (13) and
where said needle drive is adjustable by means of at least one holding-fixture drive (8) in an adjustment plane (7) parallel to the circuit board (5), the drives (8, 13) being controlled by a drive control (10) to steer the needle tip (18) onto a predetermined spatial coordinate,
wherein a distance measuring device (25, 13') is provided to measure the distance between the adjustment plane (7) and the circuit board (5, 5') at least at one site and to transmit measured values to the drive control (10), said drive control being designed to correct—before electrical contact between the needle (15) and contact areas (21) takes place—the spatial coordinates of the contact areas (21, 21') by taking into account the measured distance values,
wherein the device is designed to make the distance measurement prior to electrical testing; and
wherein the device is designed to measure the distance at several sites of the circuit board (5, 5') and to derive from these measurements a distance profile of the circuit board (5, 5').

2. Printed circuit board test device (1) comprising:
a support device (4) receiving a circuit board (5) at latter's edge, said board being designed to receive electrical or electronic components (20) or being fitted with them,
at least one needle (15) which is designed to make electrical contact with contact areas (21) on the circuit board (5) and which is connected to an electrical testing device (17),
said needle (15) being obliquely arranged and adjustable in the direction of the needle by a needle drive (13) and
where said needle drive is adjustable by means of at least one holding-fixture drive (8) in an adjustment plane (7) parallel to the circuit board (5), the drives (8, 13) being controlled by a drive control (10) to steer the needle tip (18) onto a predetermined spatial coordinate
wherein a distance measuring device (25, 13') is provided to measure the distance between the adjustment plane (7) and the circuit board (5, 5') at least at one site and to transmit measured values to the drive control (10), said drive control being designed to correct—before electrical contact between the needle (15) and contact areas (21) takes place—the spatial coordinates of the contact areas (21, 21') by taking into account the measured distance value and wherein the said device (1) is designed to measure a distance value and to calculate the distances of any site of the circuit board (5, 5') on the basis of a known bending curve of said circuit board.

* * * * *